(12) United States Patent
Fan

(10) Patent No.: US 10,270,459 B2
(45) Date of Patent: Apr. 23, 2019

(54) DAC CAPACITOR ARRAY, SAR ANALOG-TO-DIGITAL CONVERTER AND METHOD FOR REDUCING POWER CONSUMPTION THEREOF

(71) Applicant: SHENZHEN GOODIX TECHNOLOGY CO., LTD., Shenzhen, Guangdong (CN)

(72) Inventor: Shuo Fan, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/827,179

(22) Filed: Nov. 30, 2017

(65) Prior Publication Data

US 2018/0091163 A1 Mar. 29, 2018

Related U.S. Application Data

(63) Continuation of application No. PCT/CN2017/103046, filed on Sep. 23, 2017.

(30) Foreign Application Priority Data

Sep. 23, 2016 (WO) ................ PCT/CN2016/099835

(51) Int. Cl.
*H03M 1/00* (2006.01)
*H03M 1/46* (2006.01)
(52) U.S. Cl.
CPC ............ *H03M 1/002* (2013.01); *H03M 1/462* (2013.01); *H03M 1/468* (2013.01)
(58) Field of Classification Search
CPC .......... H03M 1/38; H03M 1/403; H03M 1/80; H03M 1/802; H03M 1/804; H03M 1/0682

(Continued)

(56) References Cited

U.S. PATENT DOCUMENTS 4,803,462 A * 2/1989 Hester ................ H03M 1/0682
  327/407
4,831,381 A * 5/1989 Hester .................. H03M 1/468
  341/162

(Continued)

FOREIGN PATENT DOCUMENTS

CN    1732624 A     2/2006
CN  102801422 A    11/2012
CN  103441765 A    12/2013

OTHER PUBLICATIONS

State Intellectual Property Office of the P.R. China (ISR/CN), "International Search Report for PCT/CN2016/099835", China, dated Jun. 5, 2017.

(Continued)

*Primary Examiner* — Khai M Nguyen
(74) *Attorney, Agent, or Firm* — Heslin Rothenberg Farley & Mesiti P.C.

(57) ABSTRACT

The present disclosure relates to a method for reducing power consumption, including: connecting one terminal of each capacitor in a first and a second capacitor array of an SAR ADC to a first reference voltage via a corresponding primary switch, connecting the other terminal of the capacitors to a positive-terminal analog input signal and a negative-terminal analog input signal respectively via a corresponding multiplexer to complete sampling; determining a value of a most-significant bit by comparing an output voltage of the first capacitor array with an output voltage of the second capacitor array, maintaining or adjusting a reference voltage connected to the other terminal of each capacitor according to the value of the most-significant bit, and determining values of a second-most-significant bit and a least-significant bit by comparing the output voltage of the first capacitor array with the output voltage of the second capacitor array.

15 Claims, 6 Drawing Sheets

(58) Field of Classification Search
USPC .................................. 341/150, 161, 163, 172
See application file for complete search history.

(56) References Cited

U.S. PATENT DOCUMENTS

| | | | | | |
|---|---|---|---|---|---|
| 4,975,700 | A * | 12/1990 | Tan | ..................... | H03M 1/0612 341/118 |
| 8,040,271 | B2 * | 10/2011 | Furuta | ................. | H03M 1/0682 341/163 |
| 8,164,504 | B2 * | 4/2012 | Cho | ..................... | H03M 1/0678 341/118 |
| 8,717,221 | B2 * | 5/2014 | Jeon | ..................... | H03M 1/0678 341/163 |
| 9,362,938 | B2 * | 6/2016 | Zare-Hoseini | ...... | H03M 1/1071 |
| 9,432,046 | B1 | 8/2016 | Yu et al. | | |
| 2007/0109168 | A1 | 5/2007 | Hennessy et al. | | |
| 2011/0227774 | A1 | 9/2011 | Cho et al. | | |

OTHER PUBLICATIONS

Communication pursuant to Article 94(3) EPC issued by the European Patent Office for European Application No. 17800998.1 dated Feb. 11, 2019.
Ndjountche, T., "Nyquist Analog-to-Digital Converters CONTENTS" In: "Nyquist Analog-to-Digital Converters CONTENTS", Chapman and Hall/CRC, pp. 573-584 (2011).

* cited by examiner

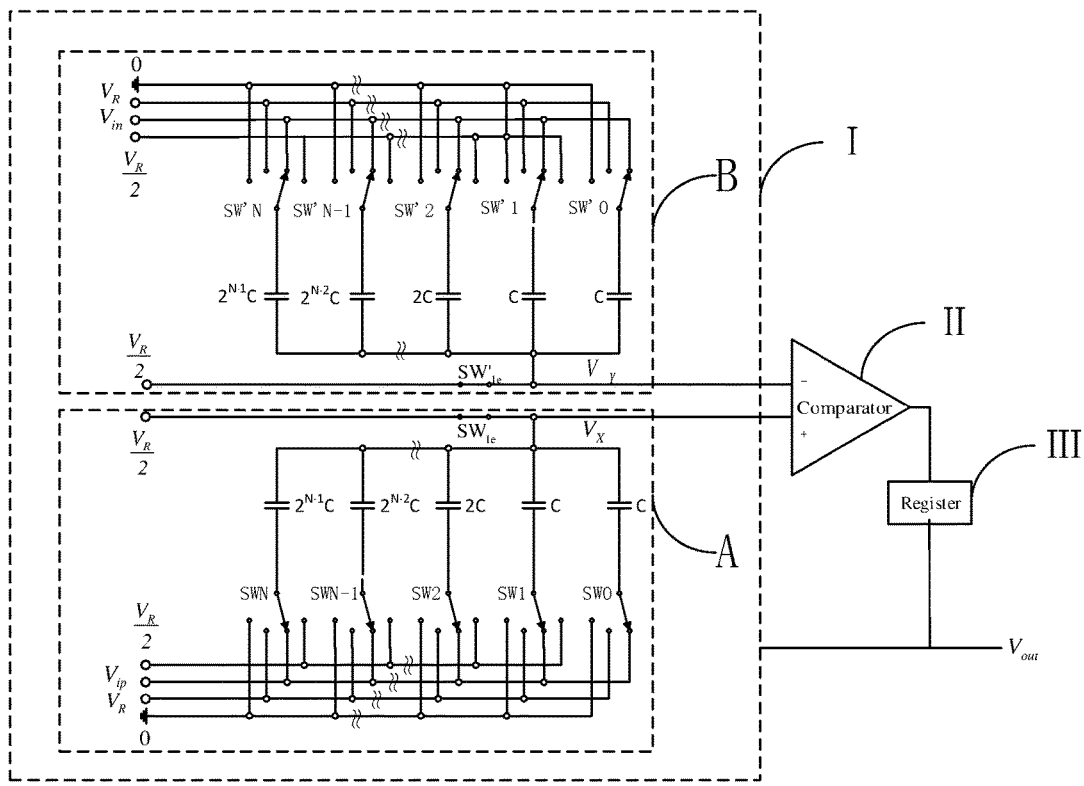

FIG. 8

S101
Connect one terminal (a common terminal) of each capacitor in a DAC capacitor array to a first reference voltage via a primary switch, and connect the other terminal of each capacitor (a free terminal) to an analog input signal via a corresponding multiplexer, to complete sampling S102
Turn off the primary switch of the DAC capacitor array, and disconnect the multiplexer from the analog input signal and connect the multiplexer to the first reference voltage, and determine a value of a most-significant bit by comparing an output voltage with the first reference voltage S103
Maintain or adjust a reference voltage to which the other terminal of each capacitor is connected according to the value of the most-significant bit, and determine values of a second-most-significant bit and a least-significant bit by further comparing the output voltage of the capacitor array with the first reference voltage

DAC CAPACITOR ARRAY, SAR ANALOG-TO-DIGITAL CONVERTER AND METHOD FOR REDUCING POWER CONSUMPTION THEREOF

CROSS REFERENCE TO RELATED APPLICATIONS

The present application is a continuation of international application No. PCT/CN2017/103046, filed on Sep. 23, 2017, which claims the priority to international application No. PCT/CN2016/099835, filed on Sep. 23, 2016, both of which are incorporated herein by reference in its entirety.

TECHNICAL FIELD

Embodiments of the present disclosure relate to the technical field of integrated circuits, and in particular, relate to a DAC capacitor array, an SAR analog-to-digital converter, and a method for reducing power consumption thereof.

BACKGROUND

A successive approximation register analog-to-digital converter (SAR ADC) is capable of converting an analog signal into a digital signal. Referring to FIG. 1, the SAR ADC is formed of a comparator, a register and a digital-to-analog converter (DAC), and converts the analog signal into the digital signal based on the following principle: comparing an analog input signal $V_i$ with an intermediate value of a reference signal $V_R$ which is an variable value acquired by an output of a D/A converter, determining to increase or decrease the digital signal input to the DAC according to the comparison result such that the intermediate value of the reference signal $V_R$ approximates to the analog input signal $V_i$, and when the intermediate value of the reference signal $V_R$ is equal to the analog input signal $V_i$, the digital signal input to the DAC is the digital signal corresponding to the analog input signal $V_i$. That is, the analog-to-digital conversion is implemented by means of successive approximation of the DAC output to the input voltage, and the process of successive approximation may be referenced to FIG. 2. As illustrated in FIG. 2, through the first comparison, the analog input signal $V_i$ is greater than the intermediate voltage $V_R/2$, thus the digital value of a most-significant bit is 1, and the output of the DAC is adjusted; and through the second comparison, the analog input signal $V_i$ is less than the intermediate voltage $V_R/2$, thus digital value of a the second-most-significant bit is 0. Comparisons are made analogously until the analog input signal $V_i$ is equal to the intermediate voltage $V_R/2$, and finally a group of digital values are obtained, that is, a digital signal obtained after the analog input signal $V_i$ is converted by the analog-to-digital converter.

The SAR analog-to-digital converter is used as a key component for interfacing between an analog module and a digital module, and is extensively applied to mobile devices, wireless sensors and the like. Due to the size and endurance of the device, the analog-to-digital converter needs to have a small size and low power consumption, such that the analog-to-digital converter can be conveniently integrated into the circuits of various devices.

SUMMARY

In view of the above, embodiments of the present disclosure provide a DAC capacitor array, an SAR analog-to-digital converter, and a method for reducing power consumption thereof, to reduce power consumption of the analog-to-digital converter.

In a first aspect, embodiments of the present disclosure provide a DAC capacitor array, including: a first capacitor array and a second capacitor array, the first capacitor array and the second capacitor array having the same structure and being respectively connected to two input terminals of a comparator; where the first capacitor array and the second capacitor array both includes a capacitor group, a primary switch and a plurality of multiplexers; where the capacitor group includes a most-significant-bit capacitor, a least-significant-bit capacitor, a supplement-bit capacitor, and at least one second-most-significant-bit capacitor;

one terminal of each capacitor in the first capacitor array is connected to one input terminal of the comparator and is connected to a first reference voltage via the primary switch in the first capacitor array, and the other terminal of each capacitor in the first capacitor array is connected to a plurality of input sources via a corresponding multiplexer in the first capacitor array;

one terminal of each capacitor in the second capacitor array is connected to the other input terminal of the comparator and is connected to the first reference voltage via the primary switch in the second capacitor array, and the other terminal of each capacitor in the second capacitor array is connected to a plurality of input sources via a corresponding multiplexer in the second capacitor array.

Further, the least-significant-bit capacitors, the second least-significant-bit capacitors, and the most-significant-bit capacitors in the first capacitor array and the second capacitor array are arranged in the form of $2^N$ based on capacitances of the capacitors, N being a non-negative integer.

Further, the supplement-bit capacitor and the least-significant-bit capacitor have the same capacitance.

Further, the input sources include an analog input signal, the first reference voltage, a second reference voltage and a reference ground; where a difference between the second reference voltage and the reference ground is 2 times the value of the first reference voltage.

In a second aspect, embodiments of the present disclosure provide an SAR analog-to-digital converter, including: a comparator, a register connected to an output terminal of the comparator, and a DAC capacitor array connected to an input terminal of the comparator; where the DAC capacitor array includes a first capacitor array and a second capacitor array, the first capacitor array and the second capacitor array having the same structure and being respectively connected to two input terminals of the comparator; where the first capacitor array and the second capacitor array both includes a capacitor group, a primary switch and a plurality of multiplexers; where the capacitor group includes a most-significant-bit capacitor, a least-significant-bit capacitor, a supplement-bit capacitor, and at least one second-most-significant-bit capacitor;

one terminal of each capacitor in the first capacitor array is connected to one input terminal of the comparator and is connected to a first reference voltage via the primary switch in the first capacitor array, and the other terminal of each capacitor in the first capacitor array is connected to a plurality of input sources via a corresponding multiplexer in the first capacitor array;

one terminal of each capacitor in the second capacitor array is connected to the other input terminal of the comparator and is connected to the first reference voltage via the primary switch in the second capacitor array, and the other terminal of each capacitor in the second capacitor array is connected to a plurality of input sources via a corresponding multiplexer in the second capacitor array.

Further, the least-significant-bit capacitors, the second least-significant-bit capacitors, and the most-significant-bit capacitors in the first capacitor array and the second capacitor array are arranged in the form of $2^N$ based on capacitances of the capacitors, N being a non-negative integer.

Further, the supplement-bit capacitor and the least-significant-bit capacitor have the same capacitance.

Further, the input sources include an analog input signal, the first reference voltage, a second reference voltage and a reference ground; where a difference between the second reference voltage and the reference ground is 2 times the value of the first reference voltage.

In a third aspect, embodiments of the present disclosure provide a method for reducing power consumption of an SAR analog-to-digital converter, applied to the above described SAR analog-to-digital converter. The method includes:

a sampling stage: connecting one terminal of each capacitor in capacitor groups in a first capacitor array and a second capacitor array to a first reference voltage via a corresponding primary switch, and connecting the other terminal of each capacitor to a positive-terminal analog input signal and a negative-terminal analog input signal respectively via a multiplexer to complete sampling; and a conversion stage: turning off the primary switches corresponding to the first capacitor array and the second capacitor array, disconnecting the multiplexer of the first capacitor array from the analog input signal and connecting the multiplexer of the first capacitor array to the first reference voltage, determining a value of a most-significant bit by comparing an output voltage of the first capacitor array with an output voltage of the second capacitor array, maintaining or adjusting a reference voltage to which the other terminal of each capacitor in the first capacitor array and the second capacitor array is connected according to the value of the most-significant bit, and determining values of a second-most-significant bit and a least-significant bit by further comparing the output voltage of the first capacitor array with the output voltage of the second capacitor array.

Further, the maintaining or adjusting a reference voltage to which the other terminal of each capacitor in the first capacitor array and the second capacitor array is connected according to the value of the most-significant bit includes:

if the output voltage of the first capacitor array is greater than the output voltage of the second capacitor array, maintaining the other terminal of each capacitor in the first capacitor array to be connected to the first reference voltage, and the reference voltage of the second capacitor array is selected to a reference ground; during a subsequent $N^{th}$-bit conversion process, if the output voltage of the first capacitor array is greater than the output voltage of the second capacitor array, connecting the $N^{th}$-bit capacitor in the first capacitor array to the first reference voltage and connecting the $N^{th}$-bit capacitor in the second capacitor array to the first reference voltage, and if the output voltage of the first capacitor array is less than the output voltage of the second capacitor array, connecting the $N^{th}$-bit capacitor in the first capacitor array to a second reference voltage and connecting the $N^{th}$-bit capacitor in the second capacitor array to the reference ground; or if the output voltage of the first capacitor array is less than the output voltage of the second capacitor array, maintaining the other terminal of each capacitor in the second capacitor array to be connected to the first reference voltage, and connecting the reference voltage of the first capacitor array to the reference ground; during a subsequent $N^{th}$-bit conversion process, if the output voltage of the first capacitor array is greater than the output voltage of the second capacitor array, still connecting the $N^{th}$-bit capacitor in the first capacitor array to a reference ground and connecting the $N^{th}$-bit capacitor in the second capacitor array to a second reference voltage, and if the output voltage of the first capacitor array is less than the output voltage of the second capacitor array, connecting the $N^{th}$-bit capacitor in the first capacitor array to the first reference voltage and connecting the $N^{th}$-bit capacitor in the second capacitor array to the first reference voltage.

Further, a supplement-bit capacitor in the first capacitor array is used as a least-significant-bit capacitor, and a value of a least-significant bit of a converted digital signal is obtained according to the supplement-bit capacitor.

With the DAC capacitor array, the SAR analog-to-digital converter and the method for reducing power consumption thereof according to the embodiments of the present disclosure, by changing a conversion process between the analog signal and the digital signal in the DAC capacitor array, the voltage variation range between two terminals of the capacitor may be narrowed, and thus the entire power consumption may be reduced.

BRIEF DESCRIPTION OF THE DRAWINGS

To describe the technical solutions of the present disclosure or the prior art more clearly, hereinafter, drawings that are to be referred for description of the embodiments or the prior art are briefly described. Apparently, the drawings described hereinafter merely illustrate some embodiments of the present disclosure. Persons of ordinary skill in the art may also derive other drawings based on the drawings described herein without any creative effort.

FIG. 8 is a schematic diagram of a differential SAR analog-to-digital converter according to an embodiment of the present disclosure;

FIG. 9 is a flowchart of a method for reducing power consumption of a single-end SAR analog-to-digital converter according to an embodiment of the present disclosure.

DETAILED DESCRIPTION

To make a person skilled in the art better understand the technical solutions of present disclosure, the technical solutions according to the embodiments of the present disclosure are clearly and completely described with reference to the accompanying drawings of the embodiments of the present disclosure. Obviously, the embodiments described herein are merely exemplary ones, but are not all the embodiments. Preferred embodiments are illustrated in the accompanying drawings. The present disclosure may be practiced in various ways, and the practice is not limited to the embodiments described hereinafter. On the contrary, these embodiments are provided to make the disclosure of the present disclosure more thoroughly and completely understood. Based on the embodiments of the present disclosure, all other embodiments derived by persons of ordinary skill in the art without any creative efforts shall fall within the protection scope of the present disclosure.

Unless otherwise defined, all the technical and scientific terms used in this specification are the same as those usually understood by persons skilled in the art of the present disclosure. The terms in the specification of the present disclosure are only used to describe the specific embodiments, but not to limit the present disclosure. Terms such as "first", "second" and the like in the specifications, claims and the accompanying drawings of the present disclosure are intended to distinguishing different objects but are not intended to define a specific sequence. In addition, terms "comprise", "include" and variations thereof are intended to define a non-exclusive meaning.

Term "embodiments" in this specification signifies that the specific characteristic, structure or feature described with reference to the embodiments may be covered in at least one embodiment of the present disclosure. This term, when appears in various positions of the description, neither indicates the same embodiment, nor indicates an independent or optional embodiment that is exclusive of the other embodiments. A person skilled in the art would implicitly or explicitly understand that the embodiments described in this specification may be incorporated with other embodiments.

Embodiment 1

Figure 1:
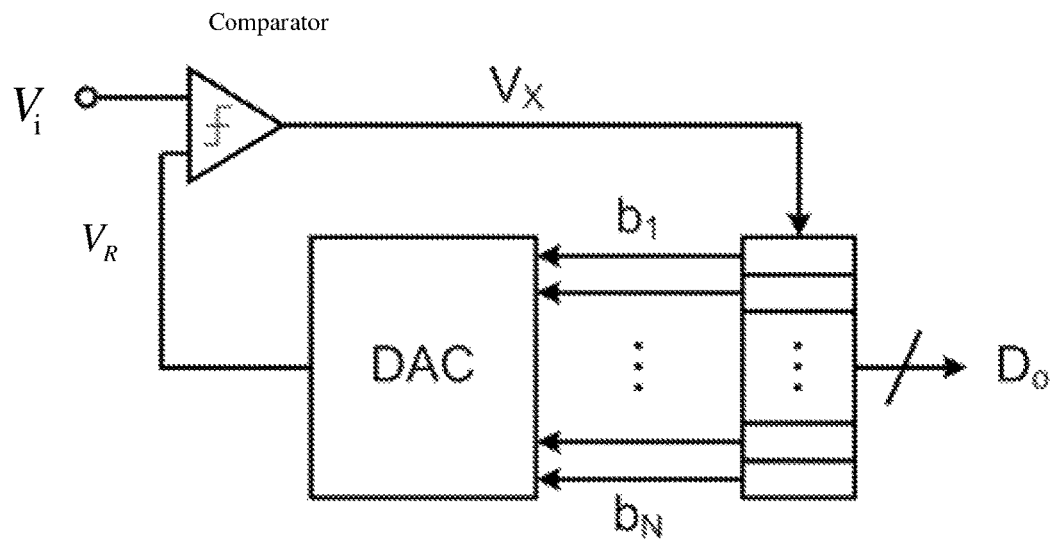
FIG. 1 is a conversion principle diagram of an SAR analog-to-digital converter.
Figure 2:
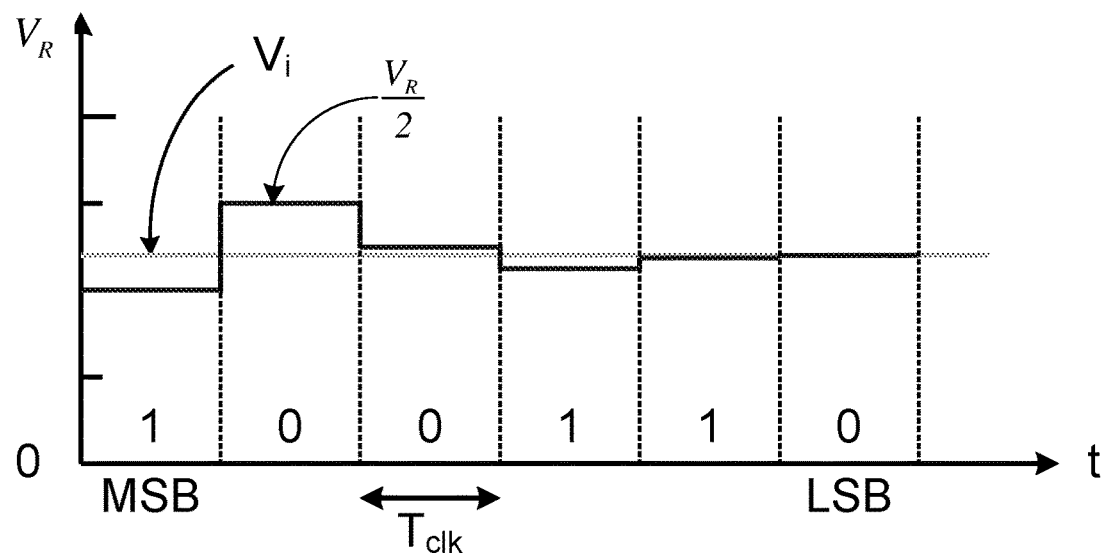
FIG. 2 is a schematic diagram of successive approximation process of the SAR analog-to-digital converter.
Figure 3:
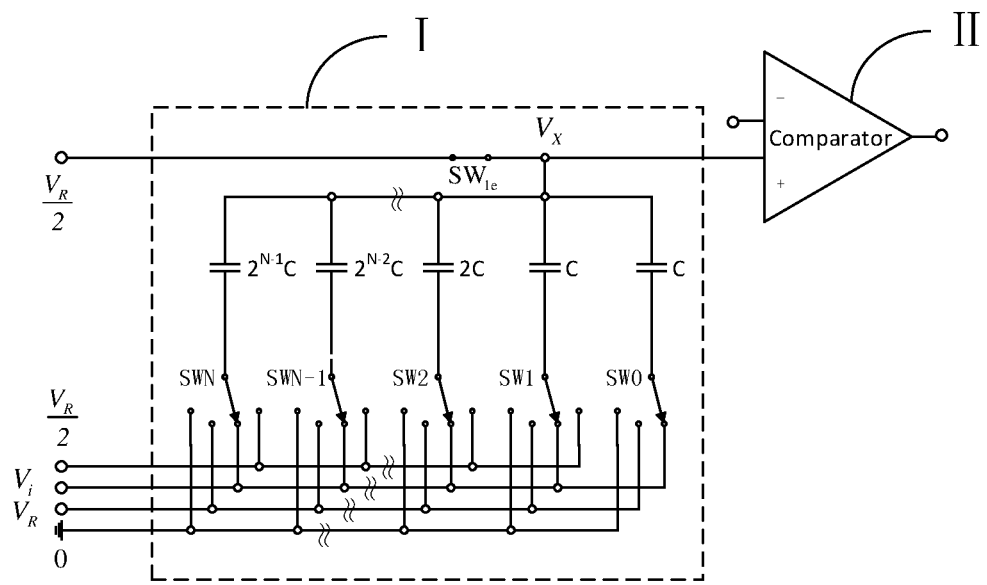
FIG. 3 is a schematic diagram of a single-end DAC capacitor array according to an embodiment of the present disclosure.

This embodiment of the present disclosure provides a DAC capacitor array I. Referring to FIG. 3, the DAC capacitor array I includes a capacitor group, a primary switch $SW_{1e}$ and a plurality of multiplexers, such as the multiplexers SW0-SWN shown in the figure, and the capacitor group includes a most-significant-bit (MSB) capacitor, a least-significant-bit (LSB) capacitor, a supplement-bit capacitor, and at least one second-most-significant-bit capacitor.

Each capacitor in the capacitor group is connected to an input terminal of a comparator II and is connected to a first reference voltage via the primary switch $SW_{1e}$. For ease of description, the terminal of each capacitor which is connected to the input terminal of the comparator II is referred to as a common terminal.

The other terminal of each capacitor in the capacitor group is connected to a plurality of input sources via a corresponding multiplexer. For ease of description, the other terminal of each capacitor is referred to as a free terminal.

Figure 4:
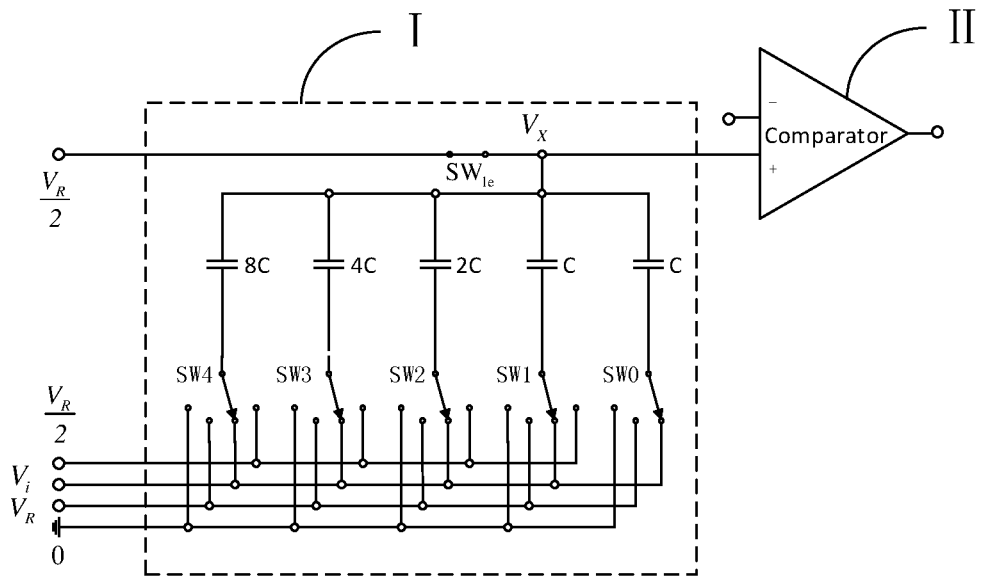
FIG. 4 is a schematic diagram of a 4-bit single-end DAC capacitor array according to an embodiment of the present disclosure.

In this embodiment of the present disclosure, except the supplement-bit capacitor, in the DAC capacitor array, all the capacitors are arranged in the form of $2^N$ based on capacitances of the capacitors, where N is a non-negative integer. Using a unit capacitor C as a reference, assume that N capacitors (including the supplement-bit capacitor and the reference unit capacitor C) are sequentially arranged in the DAC capacitor array, and the minimum capacitor is C which is referred to as the unit capacitor in the embodiment of the present disclosure, then in this embodiment, capacitances of the capacitors except in the supplement-bit capacitor are sequentially C, 2C, 4C, . . . , $2^{N-1}$C. In addition, the capacitance of the supplement-bit capacitor is equal to the unit capacitor C. The supplement-bit capacitor is to ensure that a ratio of the total capacitance value of all the capacitors to the capacitance of the unit capacitor is an integer multiple of 2. That is, by using the supplement-bit capacitor, the DAC capacitor array I may be changed from an odd-number level to an even-number level. Specifically, using a DAC capacitor array in 4-bit single-end SAR analog-to-digital converter as an example, the DAC capacitor array I according to this embodiment is described. As illustrated in FIG. 4, all the capacitors in the DAC capacitor array I are arranged in a binary form, capacitance are respectively C, 2C, 4C and 8C, that is, in an ascending order from the least-significant-bit capacitor to the most-significant-bit capacitor in terms of capacitance. Specifically, in two neighboring capacitors, the ratio of the capacitance of the most-significant-bit capacitor to the capacitance of the least-significant-bit capacitor is 2.

In this embodiment of the present disclosure, the input sources include an analog input signal $V_i$, a first reference voltage, a second reference voltage and a reference ground. The analog input signal $V_i$ is an analog to be subjected to analog-to-digital conversion. The difference between the second reference voltage and the reference ground is twice the first reference voltage. In this embodiment, the first reference voltage is $V_R/2$, the second reference voltage is $V_R$, and the reference ground is 0.

Embodiment 2

Figure 5:
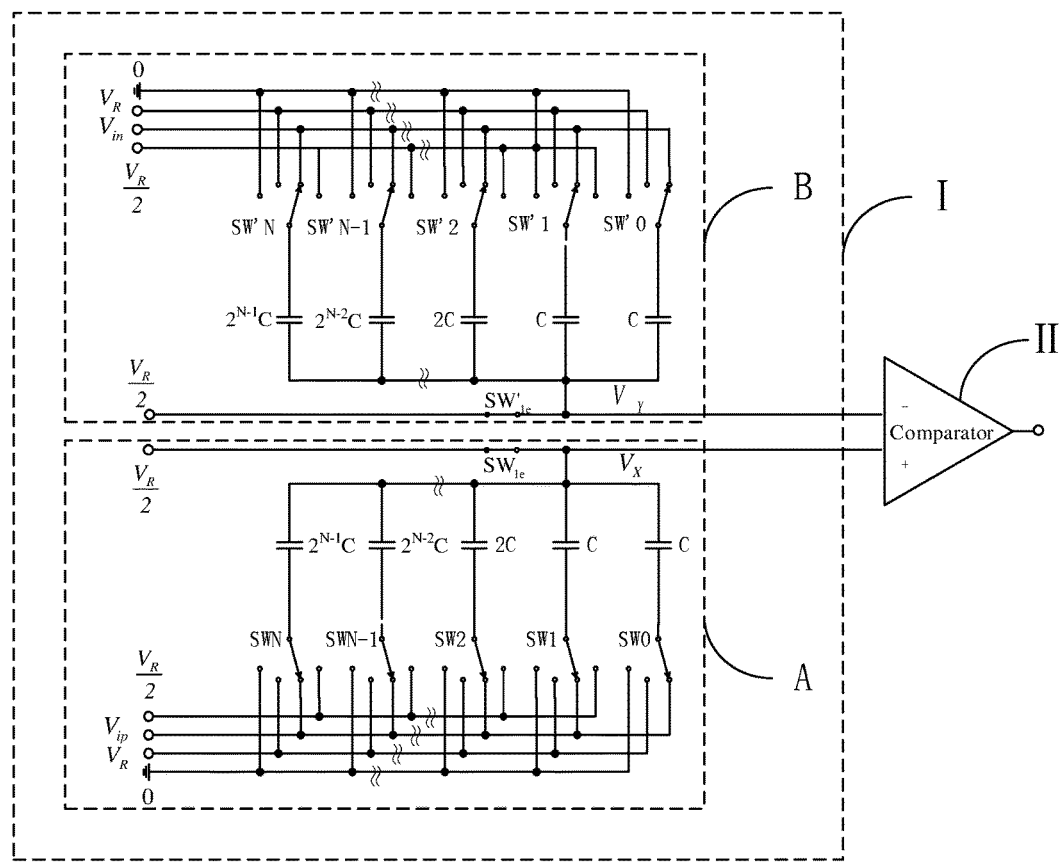
FIG. 5 is a schematic diagram of a differential DAC capacitor array according to an embodiment of the present disclosure.

This embodiment of the present disclosure provides another DAC capacitor array I. Referring to FIG. 5, the DAC capacitor array I includes a first capacitor array A and a second capacitor array B. The first capacitor array A and the second capacitor array B have the same structure, and are respectively connected to two input terminals of a comparator II, thereby forming a differential DAC capacitor array.

Specifically, the first capacitor array A includes a capacitor group, a primary switch $SW_{1e}$ and a plurality of multiplexers. The multiplexers of the first capacitor array A are SW0-SWN as illustrated in FIG. 5. Similarly, the second capacitor array B includes a capacitor group, a primary switch $SW'_{1e}$ and a plurality of multiplexers. The multiplexers of the second capacitor array B are SW'0-SW'N as illustrated in FIG. 5. The capacitor group in the first capacitor array A and the capacitor group in the second capacitor array B have the same capacitor arrangement, and both includes a most-significant-bit (MSB) capacitor, a least-significant-bit (LSB) capacitor, a supplement-bit capacitor, and at least one second-most-significant-bit capacitor.

In this embodiment of the present disclosure, except the supplement-bit capacitor, in the first capacitor array A and the second capacitor array B, all the capacitors are arranged in the form of $2^N$ based on capacitances of the capacitors, where N is a non-negative integer. Using a unit capacitor C as a reference, assume that N capacitors (including the supplement-bit capacitor and the reference unit capacitor C) are sequentially arranged in the first DAC capacitor array A and the second DAC capacitor array B, and the minimum capacitor is C which is referred to as the unit capacitor in the embodiment of the present disclosure, then in this embodiment, capacitances of the capacitors except in the supplement-bit capacitor are sequentially C, 2C, 4C, . . . , $2^{N-1}$C. In addition, the capacitance of the supplement-bit capacitor is equal to the unit capacitor C. The supplement-bit capacitor is to ensure that a ratio of the total capacitance value of all the capacitors to the capacitance of the unit capacitor is an integer multiple of 2. That is, by using the supplement-bit capacitor, the DAC capacitor array I may be changed from an odd-number level to an even-number level.

Further, each capacitor in the first capacitor array A is connected to one input terminal of the comparator II, and is connected to the first reference voltage via the primary switch $SW_{1e}$; and each capacitor in the second capacitor array B is connected to the other input terminal of the comparator II, and is connected to the first reference voltage via the primary switch $SW'_{1e}$.

For ease of description, one terminal, which is connected to the input terminal of the comparator II, of each capacitor in the capacitor groups in the first capacitor array A and the second capacitor array B is referred to as a common terminal and the other terminal of each capacitor is referred to as a free terminal.

The free terminal of each capacitor in the capacitor groups in the first capacitor array A and the second capacitor array B is connected to a plurality of input sources via a corresponding multiplexer. The input sources include an analog input signal $V_i$, the first reference voltage, the second reference voltage and a reference ground. The analog input signal $V_i$ is an analog to be subjected to analog-to-digital conversion. The difference between the second reference voltage and the reference ground is twice the first reference voltage. In this embodiment, the first reference voltage is $V_R/2$, the second reference voltage is $V_R$, and the reference ground is 0.

Figure 6:
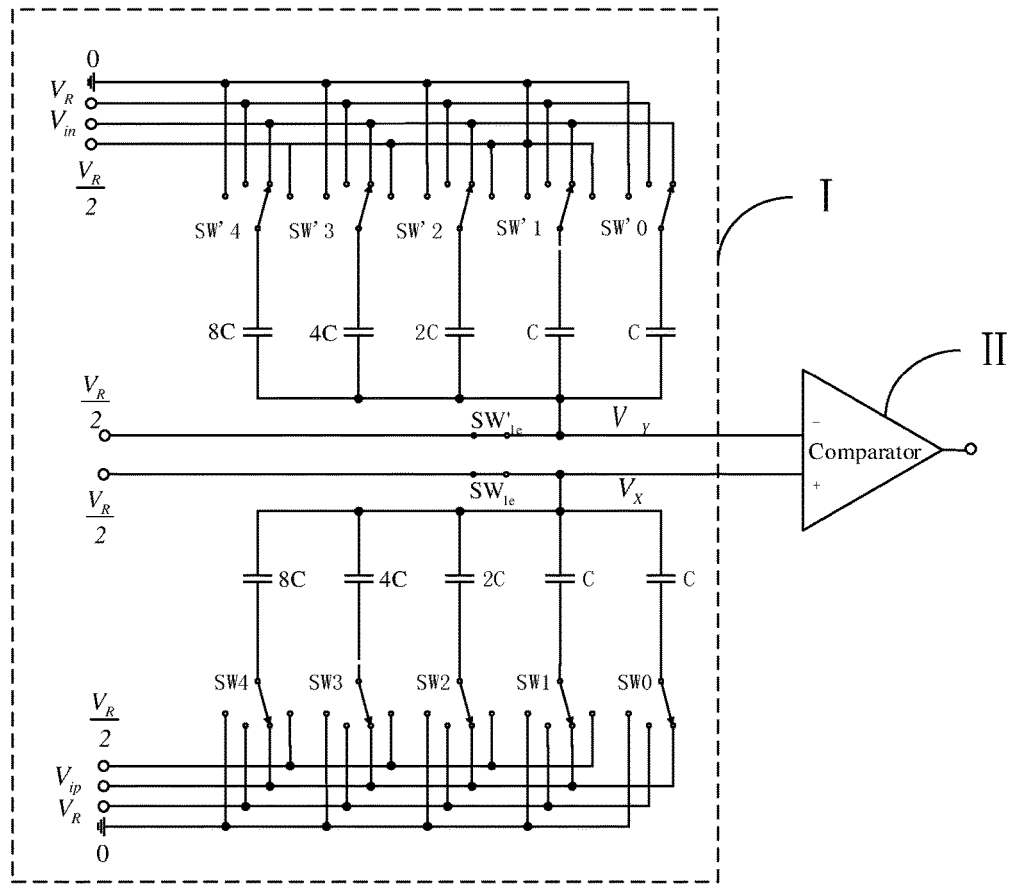
FIG. 6 is a schematic diagram of a 4-bit differential DAC capacitor array according to an embodiment of the present disclosure.

FIG. 6 illustrates a 4-bit differential DAC capacitor array.

Embodiment 3

Figure 7:
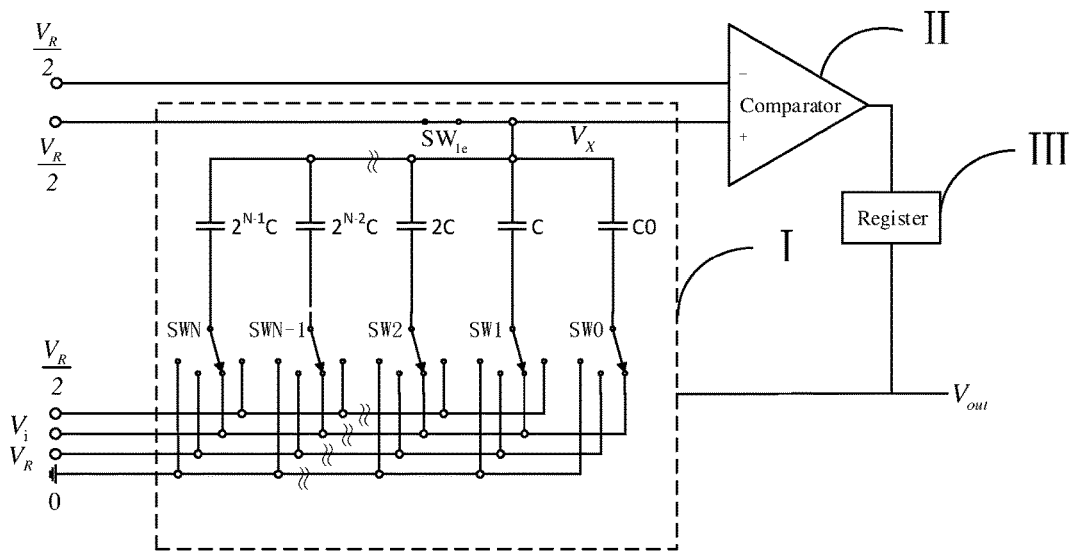
FIG. 7 is a schematic diagram of a single-end SAR analog-to-digital converter according to an embodiment of the present disclosure.

This embodiment of the present disclosure further provides an SAR analog-to-digital converter. Referring to FIG. 7, the SAR analog-to-digital converter includes a comparator II, a register III connected to an output terminal of the comparator II, and a DAC capacitor array I connected to an input terminal of the comparator II. The DAC capacitor array I is the DAC capacitor array as described in the above embodiments.

Embodiment 4

This embodiment of the present disclosure provides an SAR analog-to-digital converter. Referring to FIG. 8, the SAR analog-to-digital converter according to this embodiment includes a comparator II, a register III connected to an output terminal of the comparator II, and a DAC capacitor array I as described in Embodiment 2. The DAC capacitor array I includes a first capacitor array A and a second capacitor array B. Two input terminals of the comparator II of the SAR analog-to-digital converter according to this embodiment are respectively connected to the first capacitor array A and the second capacitor array B, thereby forming a differential SAR analog-to-digital converter. The differential SAR analog-to-digital converter has two analog signal inputs $V_{ip}$ and $V_{in}$. $V_{ip}$ is an input source at a positive input terminal of the comparator II, and $V_{in}$ is an input source at a negative input terminal of the comparator II. $V_{ip}$ and $V_{in}$ are respectively sampled to the first capacitor array A and the second capacitor array B.

Embodiment 5

This embodiment of the present disclosure provides a method for reducing power consumption of the SAR analog-to-digital converter as described in Embodiment 3. Referring to FIG. 9 and FIG. 7, in an analog-to-digital conversion process, a sampling stage and a conversion stage are involved. Correspondingly, the method also includes sampling stage processing and conversion stage processing. The method includes the following steps:

S101: connecting one terminal (a common terminal) of each capacitor in a DAC capacitor array to a first reference voltage via a primary switch, and connecting the other terminal of each capacitor (a free terminal) to an analog input signal via a corresponding multiplexer, to complete sampling;

S102: turning off the primary switch of the DAC capacitor array, and disconnecting the multiplexer from the analog input signal and connecting the multiplexer to the first reference voltage, and determining a value of a most-significant bit by comparing an output voltage $V_X$ with the first reference voltage; and S103: maintaining or adjusting a reference voltage to which the other terminal of each capacitor is connected according to the value of the most-significant bit, and determining values of a second-most-significant bit and a least-significant bit by further comparing the output voltage of the DAC capacitor array with the first reference voltage.

Specifically, referring to FIG. 3, FIG. 4 and FIG. 7:

At the sampling stage, one terminal of each capacitor in a DAC capacitor array I is connected to a first reference voltage $V_R/2$ via a primary switch $SW_{1e}$, and the other terminal of each capacitor is connected to an analog input signal $V_i$ via a corresponding multiplexer, to complete sampling.

Using a 4-bit single-end SAR analog-to-digital converter as an example, referring to FIG. 4 at the sampling stage:

The free terminal of each capacitor in the DAC capacitor array is connected to the analog input signal $V_i$; and the common terminal of each capacitor is connected to the reference voltage $V_R/2$ and connected to a positive input terminal of a comparator II, which is marked as $V_X$. Finally, the input voltage $V_i$ is sampled to the free terminal of each capacitor. In this embodiment, the free terminal of each capacitor is an upper plate of the capacitor, and the common terminal is a lower plate of the capacitor. Optionally, the DAC capacitor array I may be connected to a negative input terminal of the comparator II.

At the conversion stage, the primary switch $SW_{1e}$ of the DAC capacitor array is turned off, the multiplexer is disconnected from the analog input signal $V_i$ and is connected to the first reference voltage $V_R/2$, a value of a most-significant bit is determined by comparing an output voltage $V_X$ with the first reference voltage $V_R/2$, a reference voltage to which the other terminal of each capacitor is connected is maintained or adjusted according to the value of the most-significant bit, and values of a second-most-significant bit and a least-significant bit are determined by further comparing the output voltage $V_X$ of the DAC capacitor array I with the first reference voltage $V_R/2$.

Using a 4-bit single-end SAR analog-to-digital converter as an example, at the conversion stage:

The upper plate of each capacitor in the DAC capacitor array I is disconnected from the analog input signal $V_i$, the upper plate of each capacitor is connected to the reference voltage $V_R/2$, and the lower plate of each capacitor is disconnected from the reference voltage $V_R/2$.

According to the law of charge conservation, the value of $V_X$ may be calculated by the following equation:

$$(V_i - V_R/2)*16C = (V_R/2 - V_X)*16C$$

Upon the sampling stage, the electric charge on all the capacitors is $Q1 = (Vi - V_R/2)*16C$.

At the conversion stage, the electric charge carried on all the capacitors is $Q2 = (V_R/2 - V_X)*16C$.

It is finally concluded:

$$V_X = V_R - V_i$$

Based on the above circuit structure, a customary conversion process may be as follows:

If $V_X<V_R/2$, then according to the equation $V_X=V_R-V_i$, $V_i>V_R/2$, MSB=1, and 8C may be connected to $V_R$ via the multiplexer SW4.

If $V_X>V_R/2$, then $V_i<V_R/2$, MSB=0, and 8C may be connected to 0 level via the multiplexer SW4.

Afterwards, at each bit, a comparison is repeatedly made between $V_X$ and $V_R/2$.

If $V_X<V_R/2$, then $V_i>V_R/2$, MSB-1=1, and 4C may be connected to $V_R$.

If $V_X>V_R/2$, then $V_i<V_R/2$, MSB-1=0, and 4C may be connected to 0 level.

Afterwards, a comparison may be made between $V_X$ and $V_R/2$.

If $V_X<V_R/2$, then $V_i>V_R/2$, MSB-2=1, and 2C may be connected to $V_R$.

If $V_X>V_R/2$, then $V_i<V_R/2$, MSB-2=0, and 2C may be connected to 0 level.

Such comparisons are made to the final unit capacitor C.

In this way, a 4-bit binary output may be obtained, that is, an ADC output. Reference may be made to the assumption examples in the following table.

| | $SW_{1e}$ | SW4 | SW3 | SW2 | SW1 | SW0 | Comparison result |
|---|---|---|---|---|---|---|---|
| Sampling stage | On | $V_i$ | $V_i$ | $V_i$ | $V_i$ | $V_i$ | / |
| Conversion stage (first comparison) | Off | $V_R/2$ | $V_R/2$ | $V_R/2$ | $V_R/2$ | $V_R/2$ | 1 |
| Conversion stage (second comparison) | Off | $V_R$ | $V_R/2$ | $V_R/2$ | $V_R/2$ | $V_R/2$ | 0 |
| Third comparison | Off | $V_R$ | 0 | $V_R/2$ | $V_R/2$ | $V_R/2$ | 0 |
| Fourth comparison | Off | $V_R$ | 0 | 0 | $V_R/2$ | $V_R/2$ | 1 |
| Fifth comparison | Off | $V_R$ | 0 | 0 | $V_R$ | $V_R/2$ | 1 |

However, when a capacitor is turned on or turned off, energy may be consumed, where the energy consumption is determined by the following formula:

$$E=CV^2$$

In the above formula, C denotes the capacitance of a capacitor, and V denotes a voltage variation on the capacitor. Generally in the SAR analog-to-digital converter, the capacitance is determined by noise and matching. The noise refers to that resistance thermal noise enters to the capacitor via the sampling and is then superimposed on a useful signal, and the matching refers to that a manufactured capacitor is deviated from a design capacitor due to a limited precision in the manufacture, and thus a capacitance ratio of any two capacitors is inconsistent with the designed value, which affect the ADC precision to some extent. The voltage is determined by a dynamic range of the ADC, which specifically refers to an input voltage range of the ADC.

As known from the above, in the customary processing, power consumption of the ADC may be reduced by reducing the number of turns-on and turns-off, or changing a dynamic range of the voltage of the capacitor such that the dynamic range is within the entire dynamic range of the ADC, or adjusting the switch logic, or changing the capacitance of the capacitor.

In this embodiment of the present disclosure, by changing the above AD conversion process, the requirements on the capacitor array are lowered and the dynamic range of the voltage of the capacitor is reduced. When the capacitance of the capacitor is lowered and the variation amount of the voltage of the capacitor is reduced, the power consumption is reduced. As known from the above, changing the above AD conversion process specifically includes: adjusting the reference voltage to which the other terminal of each capacitor is connected after the value of the most-significant bit is determined, and determining the values of the second-most-significant bit and the least-significant bit by further comparing the output voltage of the capacitor group with the first reference voltage.

In this embodiment of the present disclosure, adjusting the reference voltage to which the other terminal of each capacitor is connected specifically includes:

if the output voltage $V_X$ of the capacitor group is greater than the first reference voltage $V_R/2$, maintaining the other terminal of each capacitor to be connected to the first reference voltage $V_R/2$; and if the output voltage $V_X$ of the capacitor group is less than the first reference voltage $V_R/2$, adjusting the first reference voltage $V_R/2$ to which the other terminal of each capacitor is connected to the second reference voltage $V_R$.

After the reference voltage is adjusted, the values of the second-most-significant bit and the least-significant bit are determined by further comparing the output voltage $V_X$ of the DAC capacitor array 1 with the first reference voltage $V_R/2$. With respect to the LSB, if the difference between the output voltage $V_X$ of the capacitor group and the first reference voltage $V_R/2$ is less than ½ of the LSB voltage of the ADC, the analog-to-digital conversion is completed and the obtained digital value is output.

Specifically, still using a 4-bit single-end SAR analog-to-digital converter as an example, assume that the 4-bit single-end SAR analog-to-digital converter has a dynamic range of $V_R$ to 0.

With reference to the above embodiment, during the process of acquiring the value of the most-significant bit, according to the equation:

$$(V_i-V_R/2)*16C=(V_R/2-V_X)*16C$$

It may be concluded that $V_X=V_R-V_i$.

In this embodiment of the present disclosure, if $V_X>V_R/2$, then $V_i>V_R/2$, MSB=1, and the upper plates of all the capacitors are connected to $V_R/2$. In this case, $V_X$ is not changed, and the range of $V_X$ is $V_R/2 \leq V_X \leq V_R$.

If $V_X<V_R/2$, then $V_i<V_R/2$, MSB=0, and the upper plates of all the capacitors may be connected to $V_R$.

Based on the equation $(V_i-V_R/2)*16C=(V_R-V_X)*16C$, it may be concluded:

$$V_X=V_R+V_R/2-V_i$$

It is apparent that in the case where MSB=1, $V_X$ is increased by $V_R/2$, and in this case, the range of $V_X$ rises to $V_R/2 \leq V_X \leq V_R$.

Relative to the traditional SAR-based conversion process, with the conversion method according to this embodiment, the range of $V_X$ is not constantly maintained within $0 \leq V_X \leq V_R$. After the value of the MSB is determined, $V_X$ may be restricted within $V_R/2 \leq V_X \leq V_R$ in the subsequent conversion process.

Typically, assume that the $N^{th}$ bit output by the DAC is Nbit, the process of acquiring the bits following the MSB is as follows:

If MSB=1, then:

If $V_X\_N<V_R/2$, then Nbit=0, and the upper plate corresponding to the $N^{th}$ bit is connected to $V_R$.

If $V_X\_N>V_R/2$, then Nbit−1=1, and the upper plate corresponding to the $N^{th}$ bit is connected to $V_R/2$.

Nbit−1 refers to the N−1$^{th}$ bit.

If MSB=0, then:

If $V_{X\_}N<V_R/2$, then Nbit=0, and the upper plate corresponding to the $N^{th}$ bit is still connected to $V_R$.

If $V_{X\_}N>V_R/2$, then Nbit−1=1, and the upper plate corresponding to the $N^{th}$ bit is connected to $V_R/2$.

Optionally, multi-bit ADC may be practiced by simple overlapping based on a 4-bit ADC.

In this embodiment of the present disclosure, changing the reference voltage to which the other terminal of each capacitor is connected specifically includes:

if the output voltage $V_X$ of the capacitor group is greater than the first reference voltage $V_R/2$, adjusting the first reference voltage $V_R/2$ to which the other terminal of each capacitor is connected to the reference ground;

if the output voltage $V_X$ of the capacitor group is less than the first reference voltage $V_R/2$, maintaining the other terminal of each capacitor to be connected to the first reference voltage $V_R/2$; and if the output voltage $V_X$ of the capacitor group is equal to first reference voltage $V_R/2$, completing the analog-to-digital conversion and outputting the obtained digital value.

In this embodiment of the present disclosure, if $V_X>V_R/2$, then $V_i>V_R/2$, MSB=1, and the upper plates of all the capacitors are still connected to 0. In this case, based on the formula $(V_i-V_R/2)*16C=(0-V_X)*16C$, it is concluded that $V_X=V_R/2-V_i$.

In this case, the range of $V_X$ is reduced to $0 \leq V_X \leq V_R/2$.

If $V_X<V_R/2$, then $V_i<V_R/2$, MSB=0, the upper plates of all the capacitors are still connected to $V_R/2$, and the range of $V_X$ is maintained within $0 \leq V_X \leq V_R/2$.

Relative to the traditional SAR-based conversion process, with the conversion method according to this embodiment, the range of $V_X$ is not constantly maintained within $0 \leq V_X \leq V_R$. After the value of the MSB is determined, VX may be restricted within $0 \leq V_X \leq V_R/2$ in the subsequent conversion process.

In this embodiment of the present disclosure, the supplement-bit capacitor is used as a least-significant-bit capacitor, and the value of the least-significant bit is obtained according to the supplement-bit capacitor. In the above example, after the value of the MSB is obtained, outputs of 4 bits may be obtained subsequently, and as a result outputs of 5 bits are obtained through the ADC. If a 4-bit ADC is to be practiced, the most-significant-bit capacitor needs to be removed. In this case, the entire capacitance is reduced by half. In addition, the subsequent capacitor matching in the subsequent ADC only needs a precision of 3 bits. The result of the most-significant bit is irrelevant to the subsequent capacitor array matching, the requirement on the capacitor matching is lowered to a half of the original requirement. Since the capacitor matching precision is inversely proportional to the square root of the area, the desired capacitance is reduced to ¼ of the original capacitance. According to the formula $E=CV^2$, the current C changes to ¼ of the original C. As revealed in the above technical content, the voltage variation range V of two terminals of the capacitor changes to a half of the original value. In this way, the entire power consumption is reduced to 1/16 of the original power consumption.

Embodiment 6

Figure 10:
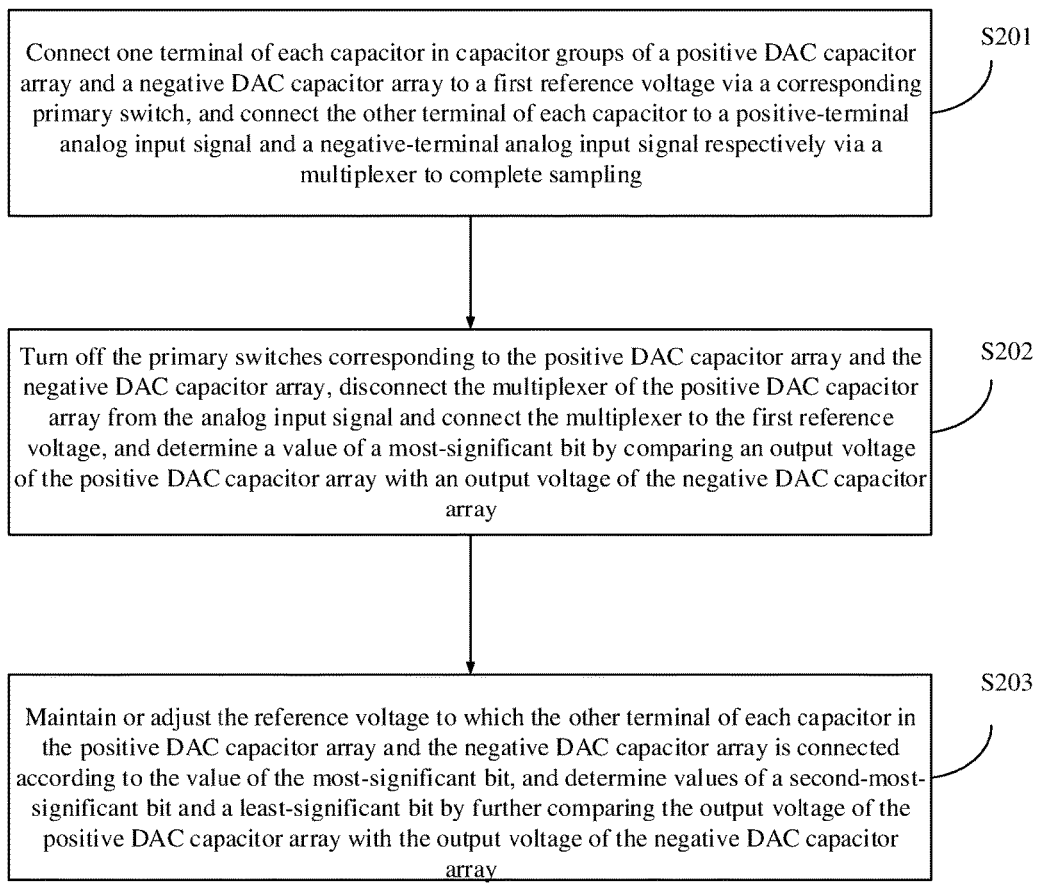
FIG. 10 is a flowchart of a method for reducing power consumption of a differential SAR analog-to-digital converter according to an embodiment of the present disclosure.

This embodiment of the present disclosure provides a method for reducing power consumption of the SAR analog-to-digital converter as described in Embodiment 4. Still referring to the circuit diagram of the SAR analog-to-digital converter as illustrated in FIG. 8, in this embodiment, a capacitor array connected to a positive input terminal of a comparator II is referred to as a positive DAC capacitor array, and a capacitor array connected to a negative input terminal of the comparator II is referred to as a negative DAC capacitor array. In FIG. 8, the positive DAC capacitor array corresponds to the first capacitor array A, and the negative DAC capacitor array corresponds to the second capacitor array B. With reference to the method flowchart as illustrated in FIG. 10, the method for reducing power consumption of the SAR analog-to-digital converter includes the following steps:

S201: connecting one terminal of each capacitor in capacitor groups of a positive DAC capacitor array and a negative DAC capacitor array to a first reference voltage via a corresponding primary switch, and connecting the other terminal of each capacitor to a positive-terminal analog input signal and a negative-terminal analog input signal respectively via a multiplexer to complete sampling;

S202: turning off the primary switches corresponding to the positive DAC capacitor array and the negative DAC capacitor array, disconnecting the multiplexer of the positive DAC capacitor array from the analog input signal and connecting the multiplexer to the first reference voltage, and determining a value of a most-significant bit by comparing an output voltage of the positive DAC capacitor array with an output voltage of the negative DAC capacitor array; and S203: maintaining or adjusting the reference voltage to which the other terminal of each capacitor in the positive DAC capacitor array and the negative DAC capacitor array is connected according to the value of the most-significant bit, and determining values of a second-most-significant bit and a least-significant bit by further comparing the output voltage of the positive DAC capacitor array with the output voltage of the negative DAC capacitor array.

Specifically, referring to FIG. 5, FIG. 6 and FIG. 8:

At the sampling stage, one terminal of each capacitor in the positive DAC capacitor array and the negative DAC capacitor array is connected to a first reference voltage $V_R/2$ via primary switches $SW_{1e}$ and $SW'_{1e}$, and the other terminal of each capacitor is connected to analog input signals $V_{ip}$ and $V_{in}$ via a corresponding multiplexer, to complete sampling.

At the conversion stage, the primary switch $SW_{1e}$ of the positive DAC capacitor array is controlled to disconnect the multiplexer of the positive DAC capacitor array from the analog input signal $V_{ip}$ and connect the multiplexer to the first reference voltage $V_R/2$; and the primary switch $SW'_{1e}$ of the negative DAC capacitor array is controlled to disconnect the multiplexer of the negative DAC capacitor array from the analog input signal $V_{in}$ and connect the multiplexer to the first reference voltage $V_R/2$.

Afterwards, the value of the most-significant bit is determined by comparing the output voltage $V_X$ of the positive DAC capacitor array and the output voltage $V_Y$ of the negative DAC capacitor array, the reference voltage to which the positive DAC capacitor array and the negative DAC capacitor array are connected is maintained or adjusted according to the value of the most-significant bit, and the values of the second-most-significant bit and the least-significant bit are determined by further comparing the output voltage $V_X$ of the positive DAC capacitor array and the output voltage $V_Y$ of the negative DAC capacitor array.

Using a 4-bit differential SAR analog-to-digital converter as an example, referring to FIG. 6, in this embodiment, the free terminal of each capacitor is an upper plate, and the common terminal of each capacitor is a lower plate.

At the sampling stage:

the free terminal (reference may be made to the above description) of each capacitor in the positive DAC capacitor array is connected to the analog input signal $V_{ip}$, the common terminal of each capacitor is connected to a reference voltage $V_R/2$ and is connected to a positive input terminal of a comparator II and marked as $V_x$, and finally the input voltage $V_{ip}$ is sampled to the free terminal of each capacitor in the positive DAC capacitor array; and correspondingly, the free terminal of each capacitor in the negative DAC capacitor array is connected to the analog input signal $V_{ip}$, the common terminal of each capacitor is connected to a reference voltage $V_R/2$ and is connected to a positive input terminal of the comparator II and marked as Vx, and finally the input voltage $V_{ip}$ is sampled to the free terminal of each capacitor in the negative DAC capacitor array.

At the conversion stage:

the upper plate of each capacitor in the positive DAC capacitor array is disconnected from the analog input signal $V_{ip}$, the upper plate of each capacitor is connected to the reference voltage $V_R/2$, and the lower plate of each capacitor is disconnected from the reference voltage $V_R/2$; and the upper plate of each capacitor in the negative DAC capacitor array is disconnected from the analog input signal $V_{in}$, the upper plate of each capacitor is connected to the reference voltage $V_R/2$, and the lower plate of each capacitor is disconnected from the reference voltage $V_R/2$.

According to the law of charge conservation, the value of $V_X$ may be calculated by the following equation:

$$(V_{ip}-V_R/2)*16C=(V_R/2-Vx)*16C$$

Upon the sampling stage, the charge carried on all the capacitors $Q1=(V_{ip}-V_R/2)*16C$.

At the conversion stage, the electric charge carried on all the capacitors $Q2=(V_R/2-Vx)*16C$.

It is finally concluded:

$$V_X=V_R-V_{ip}$$

Similarly, it may be concluded that the value of $V_Y$ is:

$$V_Y=V_R-V_{in}$$

Further, the subsequent specific analog-to-digital conversion process is as follows:

(1) If $V_X<V_Y$, then $V_{ip}>V_{in}$, MSB=1, the capacitor 8C in the positive DAC capacitor array may be connected to $\frac{3}{4}V_R$ via the multiplexer SW4, and the capacitor 8C in the negative DAC capacitor array may be connected to $\frac{1}{4}V_R$ via the multiplexer SW'4.

Afterwards, at each bit, a comparison is repeatedly made between $V_X$ and $V_Y$.

If $V_X<V_Y$, then MSB-1=1, the capacitor 4C in the positive DAC capacitor array may be connected to $V_R$, and the capacitor 4C in the negative DAC capacitor may be connected to 0.

If $V_X>V_Y$, then MSB-1=0, the capacitor 4C in the positive DAC capacitor array may be connected to $\frac{1}{2}V_R$, and the capacitor 4C in the negative DAC capacitor may be connected to $\frac{1}{2}V_R$.

Afterwards, a comparison is further made between $V_X$ and $V_Y$.

If $V_X<V_R/2$, then MSB-2=1, the capacitor 2C in the positive DAC capacitor array may be connected to $V_R$, and the capacitor 2C in the negative DAC capacitor may be connected to 0.

If $V_X>V_R/2$, then MSB-2=0, the capacitor 2C in the positive DAC capacitor array may be connected to $\frac{1}{2}V_R$, and the capacitor 2C in the negative DAC capacitor may be connected to $\frac{1}{2}V_R$.

Such comparisons are made to the final unit capacitor C.

(2) If $V_X<V_Y$, then $V_{ip}>V_{in}$, MSB=0, the capacitor 8C in the positive DAC capacitor array may be connected to $\frac{1}{4}V_R$ via the multiplexer SW4, and the capacitor 8C in the negative DAC capacitor array may be connected to $\frac{3}{4}V_R$ via the multiplexer SW'4.

Afterwards, at each bit, a comparison is repeatedly made between $V_X$ and $V_Y$.

If $V_X<V_Y$, then MSB-1=1, the capacitor 4C in the positive DAC capacitor array may be connected to 0, and the capacitor 4C in the negative DAC capacitor may be connected to $V_R$.

If $V_X>V_Y$, then MSB-1=0, the capacitor 4C in the positive DAC capacitor array may be connected to $\frac{1}{2}V_R$, and the capacitor 4C in the negative DAC capacitor may be connected to $\frac{1}{2}V_R$.

Afterwards, a comparison is further made between $V_X$ and $V_Y$.

If $V_X<V_R/2$, then MSB-2=1, the capacitor 2C in the positive DAC capacitor array may be connected to 0, and the capacitor 2C in the negative DAC capacitor may be connected to $V_R$.

If $V_X>V_R/2$, then MSB-2=0, the capacitor 2C in the positive DAC capacitor array may be connected to $\frac{1}{2}V_R$, and the capacitor 2C in the negative DAC capacitor may be connected to $\frac{1}{2}V_R$.

Such comparisons are made to the final unit capacitor C.

In this way, a 4-bit binary digital signal output corresponding to the analog input signal $V_{ip}$ may be obtained, that is, an ADC output.

However, when a capacitor is turned on or turned off, energy may be consumed, where the energy consumption is determined by the following formula:

$$E=CV^2$$

In the above formula, C denotes the capacitance of a capacitor, and V denotes a voltage variation on the capacitor. Generally in the SAR analog-to-digital converter, the capacitance is determined by noise and matching. The noise refers to that resistance thermal noise enters to the capacitor via the sampling and is then superimposed on a useful signal, and the matching refers to that a manufactured capacitor is deviated from a design capacitor due to a limited precision in the manufacture, and thus a capacitance ratio of any two capacitors is inconsistent with the designed value, which affect the ADC precision to some extent. The voltage is determined by a dynamic range of the ADC, which specifically refers to an input voltage range of the ADC.

As known from the above, in the customary processing, power consumption of the ADC may be reduced by reducing the number of turns-on and turns-off, or changing a dynamic range of the voltage of the capacitor such that the dynamic range is within the entire dynamic range of the ADC, or adjusting the switch logic, or changing the capacitance of the capacitor.

In this embodiment of the present disclosure, by changing the above AD conversion process, the requirements on the capacitor array are lowered and the dynamic range of the voltage of the capacitor is reduced. When the capacitance of the capacitor is lowered and the variation amount of the voltage of the capacitor is reduced, the power consumption is reduced. As known from the above, changing the above AD conversion process specifically includes: adjusting the reference voltage to which the other terminal of each capacitor is connected after the value of the most-significant bit is determined, and determining the values of the second-most-significant bit and the least-significant bit by further comparing the output voltage of the capacitor group and the first reference voltage. In addition, in the above conversion process, the reference voltages of the two capacitor arrays connected to the input terminals of the comparator II are changed according to the output value of the most-significant bit, and the reference voltages to which the two capacitor arrays are connected are maintained in a connection state according to the conversion value of the previous bit. During the adjustment, the charge in each capacitor in the two capacitor arrays is not changed, and thus no power is consumed, thereby reducing the power consumption of the entire analog-to-digital conversion.

With the DAC capacitor array, the SAR analog-to-digital converter and the method for reducing power consumption thereof according to the embodiments of the present disclosure, by changing a conversion process between the analog signal and the digital signal in the DAC capacitor array, the voltage range in the sampling cycle may be narrowed to $V_R$ to 0, and the voltage range between two terminals of the entire DAC capacitor is narrowed to $V_R/2$ to VR, thereby reducing the voltage variation range between two terminals of the capacitor, and thus reducing the entire power consumption. In addition, the value of the least-significant bit is acquired via the supplement-bit capacitor, such that on the premise of the same conversion precision, the size of each capacitor in the DAC capacitor array is reduced, and thus the volume of the SAR analog-to-digital converter is reduced and the power consumption is lowered. Further, in chip manufacturing, the circuit area is greatly reduced due to reduction of the capacitor size, such that the chip cost is lowered.

Described above are exemplary embodiments of the present disclosure, which are not intended to limit the protection scope of the present disclosure. Although the present disclosure is described in detail with reference to the above embodiments, a person skilled in the art would still make modifications to the specific embodiments and the technical solutions disclosed therein, or would still make equivalent replacements to a part of the technical features therein. Any equivalent structure made based on the specification and accompanying drawings of the present disclosure, even if being directly or indirectly applied to some other related technical fields, shall all fall within the protection scope of the present disclosure.

What is claimed is:

1. A digital-to-analog converter (DAC) capacitor array, comprising:
a first capacitor array and a second capacitor array, wherein each of the first capacitor array and the second capacitor array comprises:
a primary switch;
a plurality of multiplexers; and
a capacitor group, comprising a most-significant-bit capacitor, a least-significant-bit capacitor, a supplement-bit capacitor, and at least one second-most-significant-bit capacitor;
wherein one terminal of each capacitor in the first capacitor array is connected to one input terminal of a comparator and is connected to a first reference voltage via the primary switch in the first capacitor array, and the other terminal of each capacitor in the first capacitor array is connected to a plurality of input sources via a corresponding multiplexer in the first capacitor array; and
one terminal of each capacitor in the second capacitor array is connected to the other input terminal of the comparator and is connected to the first reference voltage via the primary switch in the second capacitor array, and the other terminal of each capacitor in the second capacitor array is connected to the plurality of input sources via a corresponding multiplexer in the second capacitor array; and
wherein the input sources comprise an analog input signal, the first reference voltage, a second reference voltage and a reference ground, and a difference between the second reference voltage and the reference ground is 2 times the value of the first reference voltage.

2. The DAC capacitor array according to claim 1, wherein the least-significant-bit capacitors, the second least-significant-bit capacitors, and the most-significant-bit capacitors in the first capacitor array and the second capacitor array are arranged in the form of $2^N$ based on capacitances of the capacitors, N being a non-negative integer.

3. The DAC capacitor array according to claim 2, wherein the supplement-bit capacitor and the least-significant-bit capacitor have the same capacitance.

4. A successive approximation register (SAR) analog-to-digital converter, comprising:
a comparator;
a register connected to an output terminal of the comparator; and
a digital-to-analog (DAC) capacitor array, comprising:
a first capacitor array and a second capacitor array, wherein each of the first capacitor array and the second capacitor array comprises:
a primary switch;
a plurality of multiplexers; and
a capacitor group, comprising a most-significant-bit capacitor, a lease-significant-bit capacitor, a supplement-bit capacitor, and at least one second-most-significant-bit capacitor;
wherein one terminal of each capacitor in the first capacitor array is connected to one input terminal of the comparator and is connected to a first reference voltage via the primary switch in the first capacitor array, and the other terminal of each capacitor in the first capacitor array is connected to a plurality of input sources via a corresponding multiplexer in the first capacitor array; and
one terminal of each capacitor in the second capacitor array is connected to the other input terminal of the comparator and is connected to the first reference voltage via the primary switch in the second capacitor array, and the other terminal of each capacitor in the second capacitor array is connected to the plurality of input sources via a corresponding multiplexer in the second capacitor array; and
wherein the input sources comprise an analog-input signal, the first reference voltage, a second reference voltage and a reference ground, and a difference between the second reference voltage and the reference ground is 2 times the value of the first reference voltage.

5. The SAR analog-to-digital converter according to claim 4, wherein the least-significant-bit capacitors, the second least-significant-bit capacitors, and the most-significant-bit capacitors in the first capacitor array and the second capacitor array are arranged in the form of $2^N$ based on capacitances of the capacitors, N being a non-negative integer.

6. The SAR analog-to-digital converter according to claim 5, wherein the supplement-bit capacitor and the least-significant-bit capacitor have the same capacitance.

7. The SAR analog-to-digital converter according to claim 4, wherein the analog input signal comprises a positive-terminal analog input signal and a negative-terminal analog input signal, when in a sampling stage of the converter, the primary switch of the first capacitor array and the primary switch of the second capacitor array are turned on, the other terminal of each capacitor of the first capacitor array is connected to the positive-terminal analog input signal via the corresponding multiplexer in the first capacitor array, the other terminal of each capacitor of the second capacitor array is connected to the negative-terminal analog input signal via the corresponding multiplexer in the second capacitor array.

8. The SAR analog-to-digital converter according to claim 7, wherein in a conversion stage of the converter, the primary switch of the first capacitor array and the primary switch of the second capacitor array are turned off, the first capacitor array is disconnected from the positive terminal analog input signal and connected to the first reference voltage via the corresponding multiplexer, a value of a most-significant bit is determined by comparing an output voltage of the first capacitor array with an output voltage of the second capacitor array.

9. The SAR analog-to-digital converter according to claim 8, wherein the input sources connect to the other terminal of each capacitor in the first capacitor array or the second capacitor array is maintained or adjusted according to the value of the most-significant bit, and values of a second-most-significant bit and a least-significant bit are determined by comparing the output voltage of the first capacitor array with the output voltage of the second capacitor array.

10. The SAR analog-to-digital converter according to claim 9, wherein if the output voltage of the first capacitor array is greater than the output voltage of the second capacitor array, the other terminal of each capacitor in the first capacitor array is maintained to be connected to the first reference voltage, and the other terminal of each capacitor of the second capacitor array is adjusted to be connected to a reference ground.

11. The SAR analog-to-digital converter according to claim 10, wherein during an $N^{th}$-bit conversion process: if the output voltage of the first capacitor array is greater than the output voltage of the second capacitor array, and $N^{th}$-bit capacitor in the first capacitor array is connected to the first reference voltage via the corresponding multiplexer, an $N^{th}$-bit capacitor in the second capacitor array is connected to the first reference voltage via the corresponding multiplexer; if the output voltage of the first capacitor array is less than the output voltage of the second capacitor array, the $N^{th}$-bit capacitor of the first capacitor array is connected to a second reference voltage and the $N^{th}$-bit capacitor of the second capacitor array is connected to a reference ground.

12. The SAR analog-to-digital converter according to claim 9, wherein if the output voltage of the first capacitor array is less than the output voltage of the second capacitor array, the other terminal of each capacitor of the second capacitor array is maintained to be connected to the first reference voltage, and the other terminal of each capacitor of the first capacitor array is adjusted to be connected to a reference ground.

13. The SAR analog-to-digital converter according to claim 12, wherein during a subsequent $N^{th}$-bit conversion process: if the output voltage of the first capacitor array is greater than the output voltage of the second capacitor array, and $N^{th}$-bit capacitor in the first capacitor array is kept to be connected a reference ground and an $N^{th}$-bit capacitor of the second capacitor array is connected to a second reference voltage; if the output voltage of the first capacitor array is less than the output voltage of the second capacitor array, the $N^{th}$-bit capacitor of the first capacitor array is connected to the first reference voltage and the $N^{th}$-bit capacitor of the second capacitor array is connected to the first reference voltage.

14. The SAR analog-to-digital converter according to claim 9, wherein the supplement-bit capacitor of the first capacitor array is configured as a least-significant-bit capacitor and the value of the least-significant bit is obtained according to the supplement-bit capacitor.

15. A method for reducing power consumption of a successive approximation register (SAR) analog-to-digital converter, comprising:
a sampling stage: connecting one terminal of each capacitor in capacitor groups in a first capacitor array and a second capacitor array to a first reference voltage via a corresponding primary switch, and connecting the other terminal of each capacitor to a positive-terminal analog input signal and a negative-terminal analog input signal respectively via a corresponding multiplexer to complete sampling; and
a conversion stage: turning off the primary switches corresponding to the first capacitor array and the second capacitor array, disconnecting the corresponding multiplexer of the first capacitor array and the second capacitor array from the analog input signal and connecting the corresponding multiplexer of the first capacitor array and the second capacitor array to the first reference voltage, determining a value of a most-significant bit by comparing an output voltage of the first capacitor array with an output voltage of the second capacitor array, maintaining or adjusting a reference voltage connected to the other terminal of each capacitor in the first capacitor array and the second capacitor array according to the value of the most-significant bit, and determining values of a second-most-significant bit and a least-significant bit by further comparing the output voltage of the first capacitor array with the output voltage of the second capacitor array; and
wherein the maintaining or adjusting a reference voltage connected to the other terminal of each capacitor in the first capacitor array and the second capacitor array according to the value of the most-significant bit comprises:
if the output voltage of the first capacitor array is greater than the output voltage of the second capacitor array, maintaining the other terminal of each capacitor in the first capacitor array to be connected to the first reference voltage, and connecting the reference voltage of the second capacitor array to a reference ground; during an Nth-bit conversion process, if the output voltage of the first capacitor array is greater than the output voltage of the second capacitor array, connecting the Nth-bit capacitor in the first capacitor array to the first reference voltage and connecting the Nth-bit capacitor in the second capacitor array to the first reference voltage, and if the output voltage of the first capacitor array is less than the output voltage of the second capacitor array, connecting the Nth-bit capacitor in the first capacitor array to a second reference voltage and connecting the Nth-bit capacitor in the second capacitor array to the reference ground; or if the output voltage of the first capacitor array is less than the output voltage of the second capacitor array, maintaining the other terminal of each capacitor in the second capacitor array to be connected to the first reference voltage, and connecting the reference voltage of first second capacitor array to the reference ground; during an Nth-bit conversion process, if the output voltage of the first capacitor array is greater than the output voltage of the second capacitor array, still connecting the Nth-bit capacitor in the first capacitor array to a reference ground and connecting the Nth-bit capacitor in the second capacitor array to a second reference voltage, and if the output voltage of the first capacitor array is less than the output voltage of the second capacitor array, connecting the Nth-bit capacitor in the first capacitor array to the first reference voltage and connecting the Nth-bit capacitor in the second capacitor array to the first reference voltage.

* * * * *